(12) United States Patent
Jacob et al.

(10) Patent No.: US 8,039,855 B2
(45) Date of Patent: Oct. 18, 2011

(54) RADIATION-EMITTING OPTICAL COMPONENT

(75) Inventors: Ulrich Jacob, Regensburg (DE);
Gertrud Kräuter, Regensburg (DE);
Andreas Plössl, Regensburg (DE)

(73) Assignee: OSRAM GmbH, München (DE)

( * ) Notice: Subject to any disclaimer, the term of this patent is extended or adjusted under 35 U.S.C. 154(b) by 316 days.

(21) Appl. No.: 10/472,023

(22) PCT Filed: Mar. 15, 2002

(86) PCT No.: PCT/DE02/00943
§ 371 (c)(1),
(2), (4) Date: Jul. 6, 2004

(87) PCT Pub. No.: WO02/075819
PCT Pub. Date: Sep. 26, 2002

(65) Prior Publication Data
US 2004/0238837 A1    Dec. 2, 2004

(30) Foreign Application Priority Data

Mar. 15, 2001    (DE) .................................. 101 12 542

(51) Int. Cl.
*H01L 33/00*    (2010.01)
(52) U.S. Cl. ............... 257/98; 257/79; 257/99; 257/100
(58) Field of Classification Search ............. 257/79–103
See application file for complete search history.

(56) References Cited

U.S. PATENT DOCUMENTS

| 3,877,052 | A |   | 4/1975  | Dixon et al.                |
|-----------|---|---|---------|-----------------------------|
| 4,990,972 | A | * | 2/1991  | Satoh et al. .......... 257/94 |
| 5,466,950 | A |   | 11/1995 | Sugawara et al.             |
| 5,696,389 | A | * | 12/1997 | Ishikawa et al. ........ 257/99 |
| 5,977,604 | A | * | 11/1999 | Babic et al. .......... 257/466 |
| 6,066,861 | A |   | 5/2000  | Höhn et al.                 |
| 6,078,064 | A | * | 6/2000  | Ming-Jiunn et al. ..... 257/103 |
| 6,121,635 | A | * | 9/2000  | Watanabe et al. ........ 257/91 |
| 6,153,895 | A | * | 11/2000 | Watanabe et al. ....... 257/101 |
| 6,340,824 | B1| * | 1/2002  | Komoto et al. ......... 257/99 |
| 6,373,188 | B1| * | 4/2002  | Johnson et al. ........ 313/506 |
| 6,507,049 | B1| * | 1/2003  | Yeager et al. ......... 257/100 |
| 6,552,487 | B1| * | 4/2003  | Ellens et al. ......... 313/503 |
| 6,563,141 | B1| * | 5/2003  | Dawson et al. ......... 257/98 |
| 7,132,691 | B1| * | 11/2006 | Tanabe et al. .......... 257/79 |
| 2002/0117672 | A1| * | 8/2002 | Chu et al. ............. 257/79 |

(Continued)

FOREIGN PATENT DOCUMENTS

DE        24 60 831 A1    12/1974

(Continued)

OTHER PUBLICATIONS

S.M. Sze, "Physics of Semiconductor Devices", John Wiley & Sons 1981, pp. 40-42.*

(Continued)

*Primary Examiner* — Johannes P Mondt
(74) *Attorney, Agent, or Firm* — Cozen O'Connor

(57) ABSTRACT

A radiation-emitting semiconductor component, having a layer structure (30) which includes an active layer (32) which, in operation, emits radiation with a spectral distribution (60), and electrical contacts (36, 38, 40) for applying a current to the layer structure (30), includes a coating layer (44) which at least partially surrounds the active layer (32) and holds back a short-wave component of the emitted radiation (60).

8 Claims, 3 Drawing Sheets

U.S. PATENT DOCUMENTS

2007/0069641 A1* 3/2007 Hasegawa et al. ............ 313/504

FOREIGN PATENT DOCUMENTS

| DE | 7827380 U1 | | 6/1979 |
|---|---|---|---|
| DE | 196 38 667 A1 | | 9/1996 |
| DE | 196 25 622 A1 | * | 1/1998 |
| DE | 199 45 465 A1 | | 9/1999 |
| FR | 2 273 438 | | 5/1974 |
| JP | 56112772 | | 9/1981 |
| JP | 59-28394 A | | 2/1984 |
| JP | 07-094781 | | 4/1995 |
| JP | 8-148717 | | 6/1996 |
| JP | 08236807 A | | 9/1996 |
| JP | 09129919 A | | 5/1997 |
| JP | 10173222 A | | 6/1998 |
| JP | 11-145519 A | * | 5/1999 |
| JP | 11-274558 | | 10/1999 |
| JP | 2001-028457 | | 1/2001 |
| WO | WO 97/48138 A2 | | 12/1997 |
| WO | WO 00 16411 | * | 3/2000 |
| WO | WO 00/38250 | * | 6/2000 |

OTHER PUBLICATIONS

J.D. Jackson, "Classical Electrodynamics", John Wiley & Sons, New York 1967 (sixth printing), pp. 602-604 (Library of Congress Catalog Card No. 62-8774).*

M.L. Scott, "Measurement of n and k in the XUV by the Angle-of-Incidence, Total-External-Reflectance Method", Chapter 9, in Handbook of Optical Constants of Solids II, Ed. E.D. Palik, Academic Press (copyright Elsevier Science, 1991), pp. 203-212, especially p. 212.*

Lai et al., "InGaN-AllnGaN Multiquantum-Well LEDs", IEEE Photonics Technology Letters, vol. 13, No. 6, pp. 559-561, Jun. 2000.*

Merriam-Webster's Collegiate Dictionary, Tenth Edition (1999), Merriam-Webster Inc., Springfield, MA, pp. 235,581, and 1174.*

Y.-K. Song et al., "A Blue Resonant Cavity Light Emitting Diode", phys. stat. sol. (a) 180, 33 (2000) S. 33-35.

Isamu Akasaki et al., "Crystal Growth and Conductivity Control of Group III Nitride Semiconductors and their Application to Short Wavelength Light Emitters", Jpn.J.Appl Phys., vol. 36 (1997) Part 1, No. 9A, S. 5393-5408.

Zweifel H., "Plastics Additives Handbook", 5th Edition, Chapter 1.7, Hanser Verlag, Munich, 2000, pp. 40-91.

Zweifel H., "Stabilization of Polimeric Materials", Ch. 2, Springer Verlag, Heidelberg 1998, pp. 41-69.

Kim J. K. et al.: "GaInN light-emitting diode with conductive omnidirectional reflector having a low-refractive-index indium-tin oxide layer", Applied Physics Letters, vol. 88, 2006.

* cited by examiner

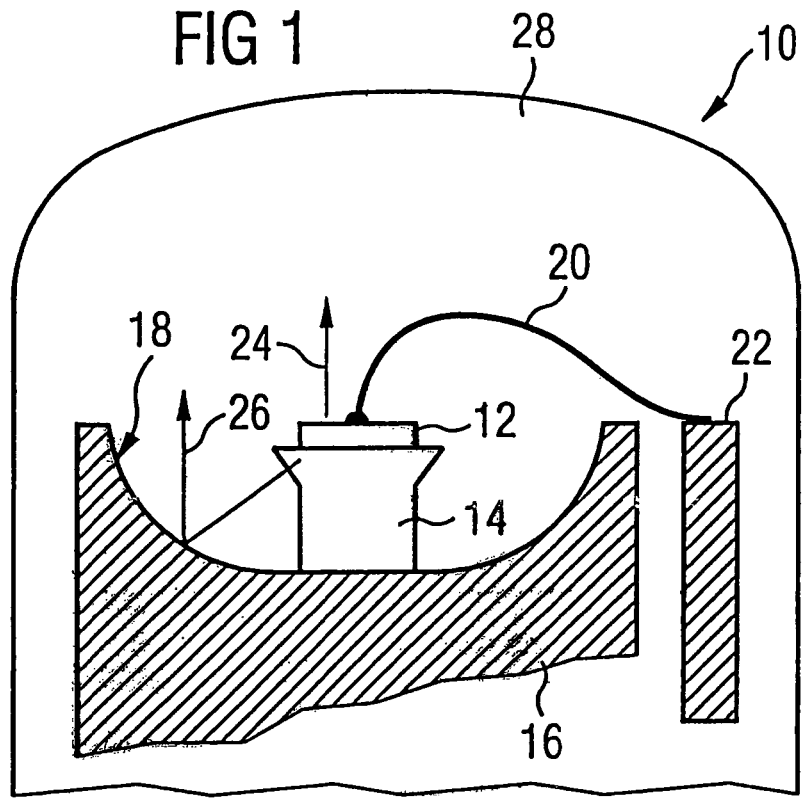
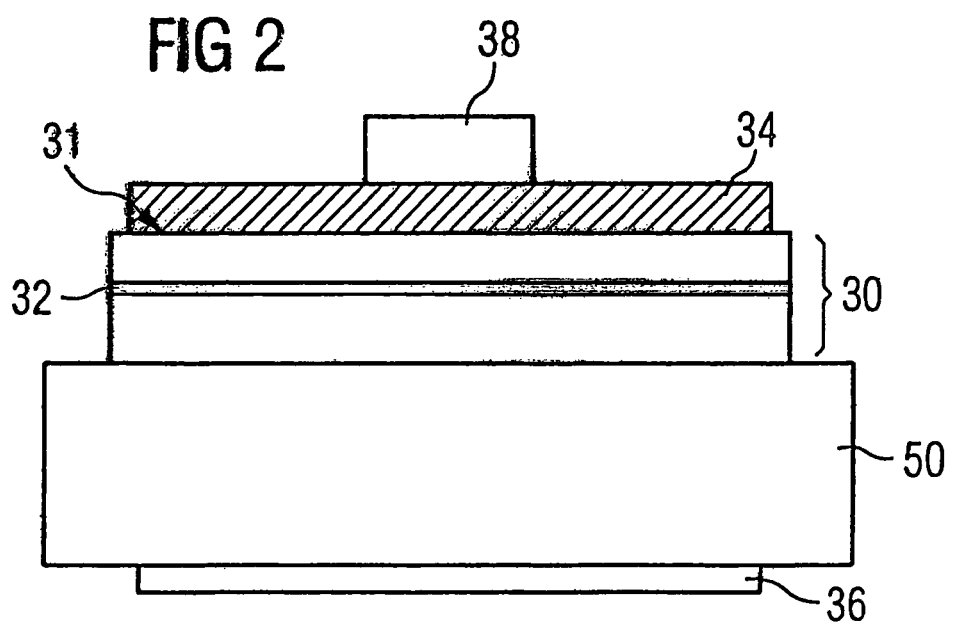

RADIATION-EMITTING OPTICAL COMPONENT

This is a U.S. national stage of application No. PCT/DE02/00943, filed on 15 Mar. 2002.

FIELD OF THE INVENTION

The present invention relates to a radiation-emitting optical component, in particular a radiation-emitting optical component having a radiation-emitting semiconductor component, which is encapsulated by a transparent material.

BACKGROUND OF THE INVENTION

Known radiation-emitting semiconductor components have a layer structure which contains an active layer which, in operation, emits radiation with a certain spectral distribution. Electrical contacts are used to apply a current to the layer structure.

It is customary to embed radiation-emitting semiconductor components of this type in a casting material which is transparent at the relevant useful wavelengths. However, particularly in the case of blue and white light-emitting diodes, the problem arises that after a prolonged operating time, the light-emitting diodes display a considerable decrease in brightness.

The light loss is caused by ageing of the casting resin, which is subject to brown discoloration after a certain operating time of the light-emitting diode. This effect considerable shortens the service life of blue and white light-emitting diodes.

It is in principle possible to slow the ageing of the casting resin. For example, unpublished tests carried out by the applicant have established that adding a stabilizer to the epoxy resins used as casting material delays the brown discoloration. The service life of blue and white light-emitting diodes can as a result be approximately doubled by the addition of a stabilizer.

An alternative approach consists in replacing the epoxy resins of the casting material with more stable polymers. In this context, silicons, whose polymer network is composed predominantly of the very stable Si—O bonds, are particularly recommended. However, silicons entail a range of other disadvantages. They have poor adhesion and a very high expansion coefficient, which lead to considerable stresses during heating and cooling.

On account of the poor adhesion, foreign substances can easily penetrate at boundary surfaces, leading to reliability problems. Moreover, silicons have a soft consistency, which can lead to problems in what are known as pick-and-place processes. Finally, silicons have a lower refractive index than hydrocarbon-based polymers, which leads to a lower light yield when they are used in light-emitting diodes.

SUMMARY OF THE INVENTION

One object of the present invention is to provide a radiation-emitting optical component of the type described above which has a long service life.

This and other objects are attained in accordance with one aspect of the present invention directed to a radiation-emitting semiconductor component, having a layer structure that includes an active layer which, in operation, emits radiation with a spectral distribution, electrical contacts for applying a current to the layer structure, and a coating layer which at least partially surrounds the active layer and holds back a short-wave component of the emitted radiation.

Another aspect of the invention is directed to a radiation-emitting optical component having the above-described radiation-emitting semiconductor component, in which the semiconductor component is encapsulated by a material which is transparent to the longer-wave component of the emitted radiation, and the coating layer is arranged between the active layer of the semiconductor component and the transparent encapsulation material.

In addition to a layer structure which includes an active layer which, in operation, emits radiation of a spectral distribution and electrical contacts for applying a current to the layer structure, a radiation-emitting semiconductor component according to the invention has a coating layer which at least partially surrounds the active layer and holds back a short-wave component of the emitted radiation.

In the context of the present invention, a coating layer is understood as meaning an optically substantially transparent layer which absorbs and/or reflects in the short-wave spectral region, in particular in the wavelength range below 430 nm.

The invention is therefore based on the concept that high-energy photons from the short-wave component of the radiation emitted by the active layer have a substantial influence on the ageing of the casting material. Accordingly, the invention provides a coating layer which holds back the short-wave component of the emitted radiation, so that only a relatively small amount or even none of this component reaches the casting material.

The coating layer can completely surround the active layer. However, for many applications it is sufficient if the coating layer only partially surrounds the active layer. By way of example, the short-wave radiation may already be prevented from entering the coating layer in some directions by bond pads, an absorbent substrate, a mounting base, housing parts or the like.

Furthermore, it may even be necessary for certain regions of the active layer not to be surrounded or at least not to be directly surrounded, for example in order to avoid an electrical short circuit of a p/n junction in the case of an electrically conductive coating layer which is applied direct to the layer structure.

Without wishing to be tied down to a specific explanation, it is assumed that the necessary precondition for damage caused by the action of light is the absorption of high-energy photons which are able to break relevant bonds during the ageing process of the irradiated material.

Relevant bonds include on the one hand the bonds of the increments which make up the polymer network (e.g. C—C, C—H, C—O, C—N). The associated bond energies are 330-380 kJ/mol. This means that these bonds can only be broken by photons with a wavelength below approximately 350 nm. However, such high-energy photons are practically not present in the spectrum of standard blue light-emitting diode chips.

It is therefore assumed that the crucial damaging influence is derived from photons with a wavelength of below approximately 430 nm, in particular below approximately 420 nm. Such photons can break open hydroperoxides occurring in the ageing sequence, whose bond energy is approximately 270-300 kJ/mol.

Typical blue light-emitting diodes with a dominant wavelength (i.e. the peak wavelength resulting from a convolution of the emission characteristic with the eye response curve) of approximately 460 to 470 nm only emit a small proportion of their overall capacity, generally no more than a few percent, in the spectral range below 400 nm.

Converter substances which absorb in the blue spectral region and emit in the yellow spectral region are used to generate white light with the aid of blue light-emitting diodes. The conventional converter substances in this case have an absorption maximum at approximately 450-470 nm, whereas radiation in the range from 350 to 430 nm is scarcely absorbed.

Therefore, the holding back of the high-energy and therefore short-wave photons, in the case of blue or white light-emitting diodes of photons with a wavelength below 430 nm, in particular below 420 nm, has no significant adverse effects.

On the other hand, it can be demonstrated that the service life of blue and white light-emitting diodes is significantly increased by the holding back of the high-energy photons.

A preferred configuration of the radiation-emitting semiconductor component has a coating layer which absorbs a short-wave component of the emitted radiation. This does not depend upon complete absorption; in some applications, to sufficiently extend the service life, it is sufficient merely to reduce the amount of radiation allowed to pass through.

Rather, it is generally important to find a balance between a high transmission through the coating layer in the longer-wave emission range of the active layer, which is used as useful radiation, and a high absorption in the short-wave radiation range.

In this configuration, the coating layer acts as a cut-off mass filter, but because the absorption coefficient does not generally change erratically, as a filter with a relatively shallow profile at the absorption edge. For this purpose, the use of an absorbent coating layer offers the advantage that there is no need to accurately set the layer thickness for the filter function, making the application of such a layer easy and inexpensive. Furthermore, the transmitted radiation does not have any pronounced angle dependency or polarization.

Another preferred configuration of the radiation-emitting semiconductor component has a coating layer which reflects a short-wave component of the emitted radiation. In particular, it is expedient to form the coating layer by means of a layered stack of dielectric layers. However, metal and semiconductor layered stacks are also suitable for the reflective coating layer.

By suitably selecting the layer materials and layer thicknesses, it is possible for an interference filter of this type to be formed as a sharp-edged interference cut-off filter, in which case the position of the absorption edge can readily be defined in such a way that the transmission in the desired emission range of the component is virtually unimpaired by the filter element, but at the same time the undesired short-wave component is efficiently held back.

The reflection of the short-wave radiation back into the active layer also has the advantage that the reflected photons contribute to the emission again via photon recycling, i.e. do not, as in the case of an absorbent coating layer, lead to the latter being heated.

A further benefit of this solution consists in its ease of integration in conventional production sequences. For example, an interference cut-off filter system can be applied and patterned, together with a standard passivation layer, by means of tried-and-tested processes.

In a preferred configuration of the radiation-emitting semiconductor component, the coating layer substantially completely covers a main surface of the layered stack.

Covering a main surface, for example the outwardly facing top face of the active layer, is often sufficient to reduce the amount of short-wave radiation which reaches the casting resin to an acceptable level. This is true in particular for conventionally constructed radiation-emitting semiconductor components, which emit the majority of the radiation via the component upper side (main surface). Regions of the main surface which are provided with connection pads and the like can be left free of coating.

If possible, it is also possible for the side faces of the active layer to be provided with the coating layer. In embodiments in which the radiation emitted through a carrier substrate is also utilized, it may be expedient for a coating layer also to be applied to the substrate. In this case, the active layer is substantially completely surrounded by the coating layer.

In a particularly expedient configuration, the coating layer applied to the main surface is electrically conductive. It can then fulfill a dual role, and as well as holding back the short-wave radiation can at the same time function as part of a first of the contacts for applying a current to the layer structure, in particular as a current spreading layer. It is therefore overall possible to dispense with one layer, making the component easier and less expensive to produce.

In a preferred configuration of the radiation-emitting semiconductor component, the active layer emits radiation in the blue and ultraviolet spectral regions, and the coating layer holds back radiation in the ultraviolet spectral region.

For the reasons explained in detail above, it is particularly expedient if the coating layer holds back radiation with a wavelength below approximately 430 nm, preferably below approximately 420 nm.

The invention also comprises a radiation-emitting optical component with a radiation-emitting semiconductor component as described above, in which the semiconductor component is encapsulated by a material which is transparent in the longer-wave component of the emitted radiation, and the coating layer is arranged between the active layer of the semiconductor component and the transparent encapsulation material.

The transparent material is preferably selected from the group consisting of epoxy resin, epoxy molding compounds and acrylates.

The invention is particularly suitable for blue or white light-emitting diodes, since the encapsulation materials which are usually used in these applications are often subject to brown discoloration on account of the short-wave radiation component.

At the same time, the invention can of course be used not only in light-emitting diodes which radiate incoherent light but also in laser diodes.

Suitable materials for the active layer in the blue spectral region are in particular nitride-based III-V semiconductor material systems, in particular GaN, InN and AlN and the ternary and quaternary mixed crystals which are based thereon, such as for example AlGaN, InGaN, AlInN or AlGaInN.

The growth substrates used may be insulating substrates, such as sapphire, or conductive substrates, such as SiC, Si, ZnO, GaAs or GaP. GaN single crystal wafers are also suitable for this purpose.

Further advantageous configurations, features and details of the invention will emerge from the dependent claims, the description of the exemplary embodiments and the drawings.

BRIEF DESCRIPTION OF THE DRAWINGS

The invention is to be explained in more detail below on the basis of exemplary embodiments in conjunction with the drawings. In each case only the elements which are pertinent to gaining an understanding of the invention are illustrated. In the drawings:

FIG. 1 shows a diagrammatic cross-sectional illustration of a radiation-emitting optical component according to the invention;

FIG. 2 shows a diagrammatic cross-sectional illustration of an exemplary embodiment of a radiation-emitting semiconductor component according to the invention in which the coating layer functions as a p-contact layer;

DETAILED DESCRIPTION OF THE DRAWINGS

Figure 3:
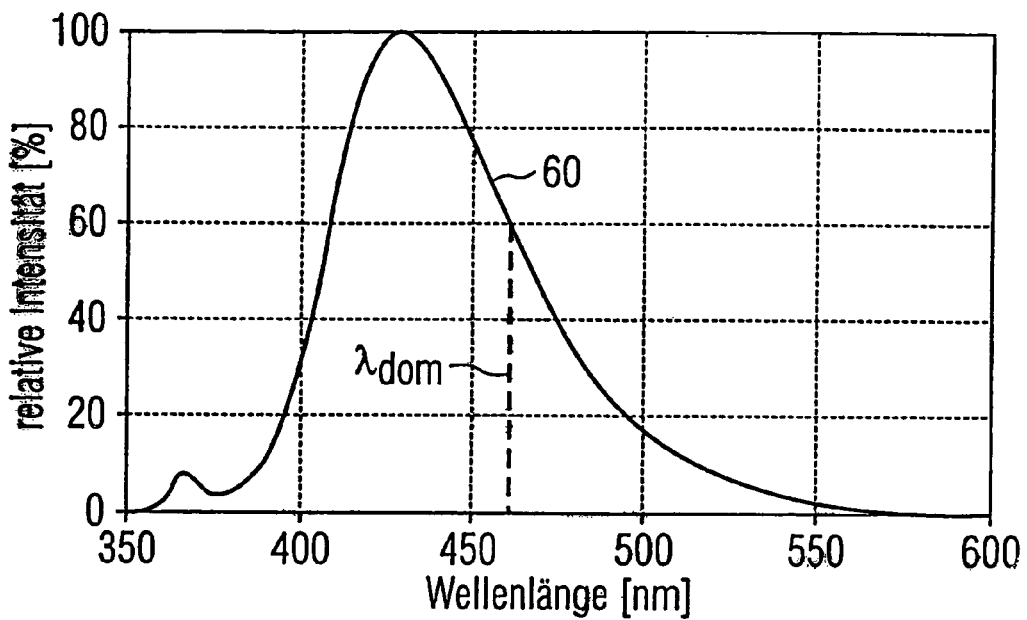
FIG. 3 shows the relative intensity of the emission from a GaN light-emitting diode as a function of wavelength.

FIG. 1 diagrammatically depicts a basic structure of a blue light-emitting diode 10 according to the invention. A layered stack 12 which includes a light-emitting active layer is arranged on a transparent, conductive mounting base 14.

The mounting base 14 is mounted in a recess of a base body 16, the sidewalls 18 of which are shaped as a parabolic reflector, so that both light beams 24 which are radiated directly upward from the layered stack and light beams 26 which are emitted downward through the transparent base 14 contribute to the light yield of the light-emitting diode 10.

The base body 16 forms an electrical connection of the radial light-emitting diode 10, which is connected to a metal contact 36 (which can be seen more clearly in FIG. 4) of the semiconductor component. A second metal contact 38 is connected to a second electrical connection part 22 of the light-emitting diode via a bonding wire 20.

For stabilization and protection purposes and to ensure good outcoupling of the emitted radiation, the entire arrangement is encapsulated with epoxy resin 28, which is transparent to the blue radiation of the light-emitting diode.

The spectral distribution 60 of the radiation from a blue GaN light-emitting diode has a maximum at approximately 430 nm with a 50% width of approximately 60 nm (FIG. 3). The dominant wavelength $\lambda_{dcm}$, i.e. the peak wavelength which results from a convolution of the spectral distribution with the eye response curve, is at approximately 460 nm. Only approximately 4.6% of the emitted capacity is in the short-wave range from 350 nm to 400 nm.

FIG. 2 shows an embodiment of a $Ga_xAl_yIn_{1-x-y}N$ light-emitting diode, where $0 \leq x \leq 1$, $0 \leq y \leq 1$, and $x+y=1$, grown on an SiC substrate 50. The layered stack 30 has in this case an active layer 32, for example a single quantum well (SQW) or a multiple quantum well (MQW). It is fundamentally known from the prior art how to select the precise structure and composition of the layered stack 30 so as to obtain desired properties of the light-emitting diode, and since the precise structure is of no particular importance in the present context, these details will not be explained further below.

In the first design of the $Ga_xAl_yIn_{1-x-y}N$ light-emitting diode, the main component of the emitted radiation is emitted via the upper side 31 of the layered stack 30. Therefore, to reduce the short-wave radiation component, it is sufficient to coat the upper side 31 of the layered stack.

In the embodiment shown in FIG. 2, a 380 nm thick layer 34 of indium tin oxide (ITO) was applied to the top face 31 after the $Ga_xAl_yIn_{1-x-y}N$ layer had been etched to isolate the p/n junction. The ITO layer 34 is conductive and therefore functions on the one hand as a p-contact layer for uniform distribution of the current which is applied to the layer structure via the metal contact 36, over the entire surface of the active layer 32.

On the other hand, the ITO layer 34 transmits radiation in the blue spectral region. The transmission is approximately 65% at 460 nm, and increases to over 90% at longer wavelengths. At the same time, the ITO layer 34 absorbs a significant component of the undesired radiation in the range from 350 nm to 420 nm. At the selected layer thickness, the absorption at 400 nm is already 55%.

The precise layer thickness of the ITO layer 34 is not critical in the present context. It can be varied in a wide range, in particular in the range from 100 nm to 1500 nm, in order to obtain an optimum balance between sufficient conductivity, high transmission at the useful wavelengths in the blue spectral region and sufficiently high absorption in the short-wave spectral region depending on the specific requirements. In one example, the ITO layer can have a thickness in the range of from 300 nm to 1000 nm.

In the configuration shown in FIG. 2, the ITO layer therefore has a dual function. It serves both as a conductive contact layer and as a coating layer which absorbs short-wave components of the light-emitting diode radiation and thereby slows the ageing process of the casting material.

Of course, instead of indium tin oxide it is also possible to use another conductive or non-conductive material as the mass filter for absorption of the short-wave radiation component. However, the material of the coating layer can only then simultaneously serve as a p-contact layer if it is conductive. Otherwise, as described below in connection with interference filter layers, it is necessary to use two separate layers which assume the functions of current distribution and radiation absorption.

Figure 4:
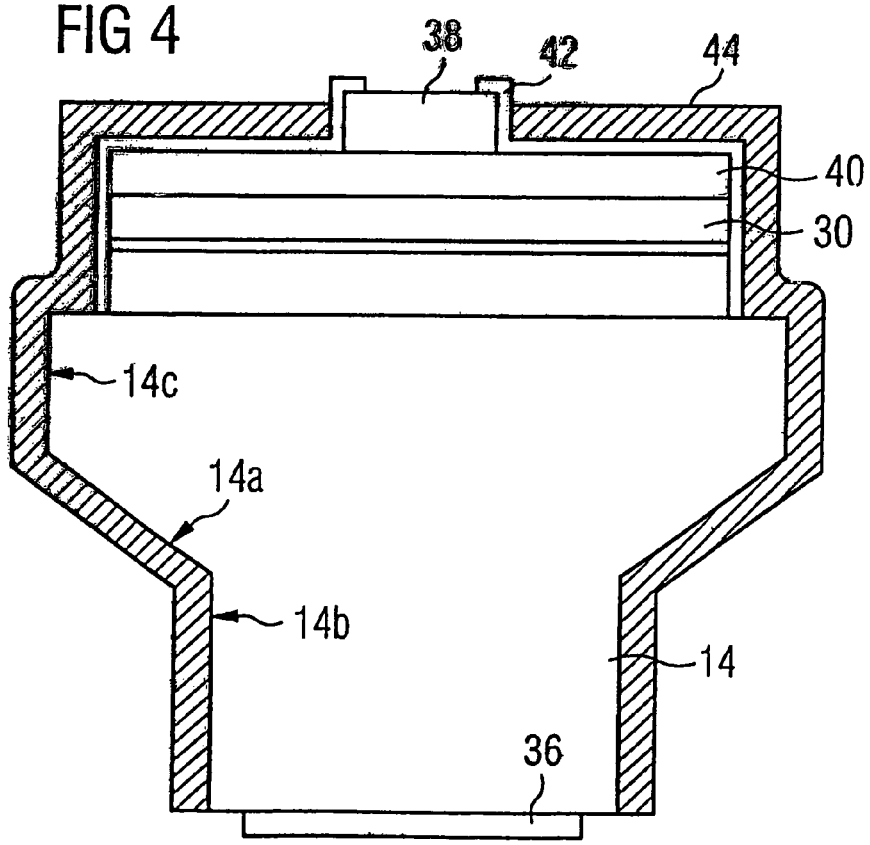
FIG. 4 shows a diagrammatic cross-sectional illustration of another exemplary embodiment of a radiation-emitting semiconductor component according to the invention with an interference filter as coating layer.

FIG. 4 shows a further design of a light-emitting diode according to the invention, in which the SiC substrate 14 is sawn in such a way that the sidewalls of the substrate below the layered stack 30 have an inclined section 14a. Above and below the inclined section 14a, the sidewalls of the substrate, in sections 14b and 14c, are perpendicular to the layered stack 30, in the customary manner. As shown in FIG. 1, the sawn substrate 14 simultaneously functions as a mounting base.

Since in this design a significant component of the useful radiation is emitted via the inclined sections 14a of the sic substrate 14, the entire module, comprising layered stack 30 and substrate 14, is surrounded by a coating layer 44. Electrical contact with the layered stack 30 is produced via a first metal contact 38 and a p-contact layer 40 on the layer upper side and a second metal contact 36 on the underside of the conductive SiC substrate 14. A transparent passivation layer 42 is provided between the coating layer 34 and the layered stack 30.

In this case, the coating layer 44 is composed of an alternating layer sequence of dielectric layers, in the exemplary embodiment a sequence of $TiO_2$ and $SiO_2$ layers (see also FIG. 6), which are optionally applied by evaporation, sputtering, plasma-enhanced chemical deposition or an ion beam coating process. The coating layer 44 therefore acts as an interference filter or as what is known as a distributed Bragg reflector (DBR). The layer thicknesses and the number of the alternating layers are thereby selected, in a manner which is known per se, in such a way that radiation with a wavelength below 420 nm is reflected by the coating layer with a desired reflectivity R at a desired edge steepness.

Figure 5:
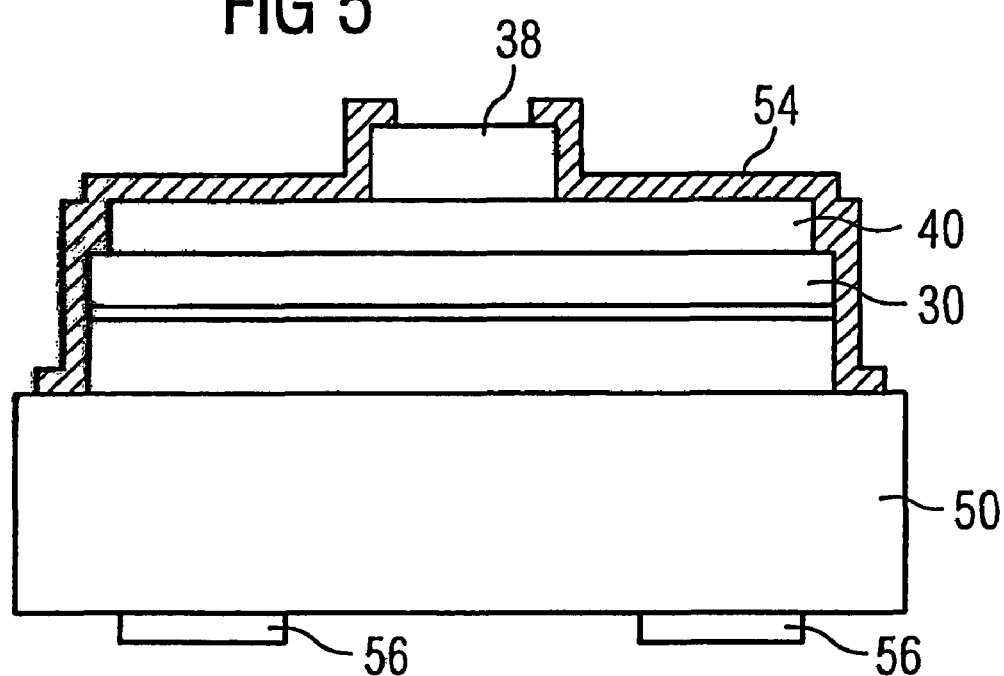
FIG. 5 shows a diagrammatic cross-sectional illustration of a further exemplary embodiment of a radiation-emitting semiconductor component according to the invention with an interference filter as coating layer.

FIG. 5 shows an embodiment of a blue light-emitting diode, in which a dielectric interference filter/coating layer 54 has been applied to the p-contact layer 40 of a light-emitting diode of conventional design. In addition to the p-contact layer 40, the coating layer can also cover the side faces of the layered stack 30, since the dielectric layers are electrically insulating and therefore do not cause any short-circuiting of the p/n junction. In this embodiment, the n-contact is formed by two metal pads 56.

Figure 6:
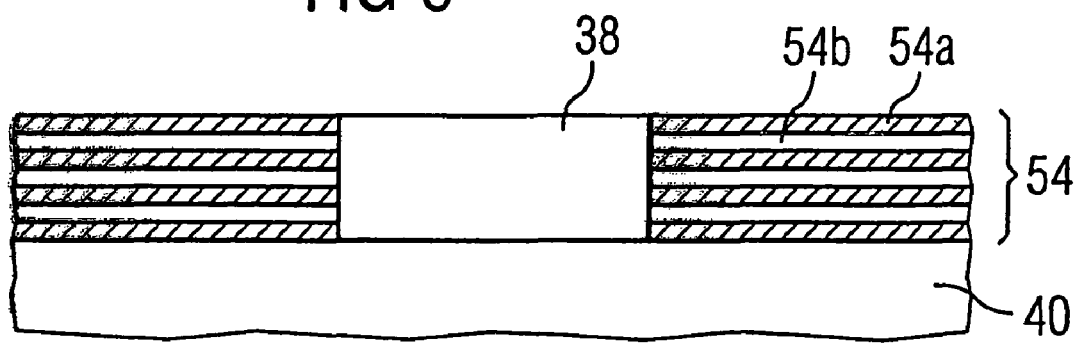
FIG. 6 shows a detailed illustration of FIG. 5 in the region of the interference filter layer.

The detailed illustration presented in FIG. 6 indicates how the interference filter stack 54 is composed of an alternating sequence of $TiO_2$ layers 54a and $SiO_2$ layers 54b, which form a distributed Bragg reflector.

The invention claimed is:

1. A radiation-emitting semiconductor component, comprising:
   a substrate;
   a semiconductor layer structure which includes an active semiconductor layer which, in operation, emits radiation with a spectral distribution;
   electrical contacts for applying a current to the layer structure; and
   a coating layer which at least partially surrounds the active semiconductor layer and comprises a stack of electrically insulating layers to form an interference edge cut-off filter, the coating layer being operable to substantially hold back a short-wave component and to virtually unimpairedly transmit a longer-wave component of the radiation emitted by the active semiconductor layer,
   wherein a majority of the emitted radiation is emitted through a top face of the semiconductor layer structure remote from the substrate,
   wherein the longer-wave component transmitted by the coating layer comprises a dominant wavelength of the radiation emitted by the active semiconductor layer, and
   wherein the coating layer is in direct contact with the top face of the semiconductor layer structure, and
   wherein the coating layer completely covers the top face of the semiconductor layer structure and side faces of the semiconductor layer structure apart from a region of the top face that is provided with an electrical contact of said electrical contacts and in which the semiconductor component is encapsulated by a material which is transparent to the longer-wave component of the emitted radiation, and the coating layer is arranged between the active layer of the semiconductor component and the transparent encapsulation material.

2. The radiation-emitting semiconductor component as claimed in claim 1, in which the active layer emits radiation in the blue and ultraviolet spectral regions, and the coating layer holds back radiation in the ultraviolet spectral region and transmits radiation in the blue spectral region.

3. The radiation-emitting semiconductor component as claimed in claim 1, in which the coating layer reflects radiation with a wavelength of less than approximately 430 nm.

4. The radiation-emitting optical component as claimed in claim 1, in which the transparent material is selected from the group consisting of epoxy resin, epoxy molding compounds and acrylates.

5. The radiation-emitting semiconductor component as claimed in claim 1, in which the coating layer comprises an alternating layer sequence of $TiO_2$ and $SiO_2$ layers.

6. The radiation-emitting semiconductor component as claimed in claim 3, in which the radiation transmitted by the coating layer comprises radiation with a wavelength between approximately 450 nm and approximately 470 nm.

7. The radiation-emitting semiconductor component as claimed in claim 6, in which the active layer emits a dominant wavelength of approximately 460-470 nm.

8. The radiation-emitting semiconductor component as claimed in claim 3, wherein the coating layer holds back radiation with a wavelength of less than approximately 420 nm.

* * * * *